(12) United States Patent
Matsushita et al.

(10) Patent No.: US 11,335,769 B2
(45) Date of Patent: May 17, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kenichi Matsushita, Nonoichi Ishikawa (JP); Tatsuya Ohguro, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/171,585

(22) Filed: Feb. 9, 2021

(65) Prior Publication Data
US 2022/0085154 A1 Mar. 17, 2022

(30) Foreign Application Priority Data

Sep. 11, 2020 (JP) .............................. JP2020-153313

(51) Int. Cl.
*H01L 29/06* (2006.01)
*H01L 29/417* (2006.01)

(52) U.S. Cl.
CPC .... *H01L 29/0607* (2013.01); *H01L 29/41708* (2013.01); *H01L 29/41725* (2013.01)

(58) Field of Classification Search
None
See application file for complete search history.

(56) References Cited

U.S. PATENT DOCUMENTS

| 6,670,710 B2 | 12/2003 | Matsunaga |
| 8,796,745 B2 | 8/2014 | Kocon |
| 8,946,719 B2 | 2/2015 | Tanaka et al. |
| 2011/0018055 A1* | 1/2011 | Ohta ................... H01L 29/7811 257/329 |

(Continued)

FOREIGN PATENT DOCUMENTS

| JP | S61-154133 A | 7/1986 |
| JP | H05-14156 A | 1/1993 |

(Continued)

*Primary Examiner* — Khaja Ahmad
(74) *Attorney, Agent, or Firm* — Allen & Overy LLP

(57) ABSTRACT

A semiconductor device includes a semiconductor part, a terminal insulating film, a first protective film, a second electrode, a terminal electrode, a first insulating film, and a second protective film. The terminal insulating film is provided on the semiconductor part in the terminal region. The first protective film is provided on the terminal insulating film. The first and second protective films includes silicon and nitrogen. The second electrode is provided on the semiconductor part in the cell region and includes an end portion located on the first protective film. The terminal electrode is provided on the first protective film in the terminal region and is connected to the semiconductor part. The first insulating film is provided on the first protective film. The first insulating film includes hydrogen and contacts the second electrode and the terminal electrode. The second protective film covers the first insulating film.

9 Claims, 6 Drawing Sheets

(56) References Cited

U.S. PATENT DOCUMENTS

| | | | |
|---|---|---|---|
| 2014/0367737 A1* | 12/2014 | Takahashi | H01L 29/8611 257/139 |
| 2016/0035840 A1* | 2/2016 | Matsudai | H01L 29/7397 257/330 |
| 2016/0284834 A1* | 9/2016 | Shimizu | H01L 21/045 |
| 2019/0273154 A1* | 9/2019 | Iwashima | H01L 29/0821 |
| 2020/0295129 A1* | 9/2020 | Kinoshita | H01L 29/0623 |

FOREIGN PATENT DOCUMENTS

| | | |
|---|---|---|
| JP | H06-224452 A | 8/1994 |
| JP | 2002-353307 A | 12/2002 |
| JP | 2014-523649 A | 9/2014 |
| WO | 2009-150862 A1 | 12/2009 |

\* cited by examiner

US 11,335,769 B2

SEMICONDUCTOR DEVICE

CROSS-REFERENCE TO RELATED APPLICATIONS

This application is based upon and claims the benefit of priority from Japanese Patent Application No. 2020-153313, filed on Sep. 11, 2020; the entire contents of which are incorporated herein by reference.

FIELD

Embodiments relate to a semiconductor device.

BACKGROUND

A high breakdown voltage semiconductor device such as an IGBT (Insulated Gate Bipolar Transistor), a MOSFET (Metal-Oxide-Semiconductor Field-Effect Transistor), an FRD (Fast Recovery Diode (a high-speed rectifying element)), or the like is used in a power device that controls a current amount supplied to an electric train or the like. High reliability of such a semiconductor device is desirable.

DETAILED DESCRIPTION

Figure 1:
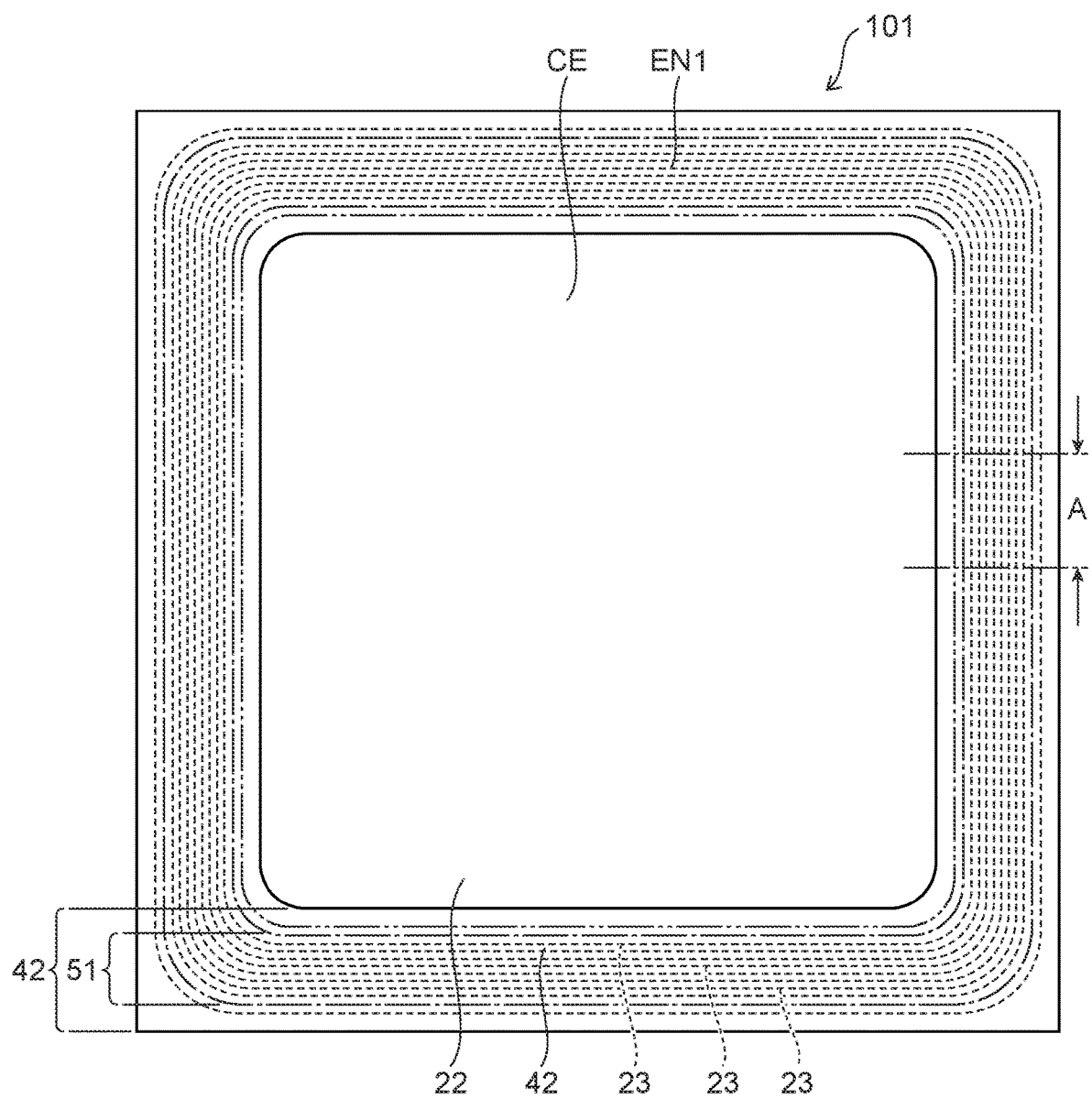
FIG. 1 is a plan view showing a semiconductor device according to a first embodiment.

A semiconductor device according to an embodiment has a cell region and a terminal region set in the device, the terminal region surrounding the cell region, the device includes a first electrode, a semiconductor part, a terminal insulating film, a first protective film, a second electrode, a terminal electrode, a first insulating film, and a second protective film. The semiconductor part is provided on the first electrode. The terminal insulating film is provided on the semiconductor part in the terminal region. The first protective film is provided on the terminal insulating film. The first protective film includes silicon and nitrogen. The second electrode is provided on the semiconductor part in the cell region. The second electrode includes an end portion located on the first protective film. The terminal electrode is provided on the first protective film in the terminal region and is connected to the semiconductor part. The first insulating film is provided on the first protective film. The first insulating film includes hydrogen and contacts the terminal electrode and the end portion of the second electrode. The first insulating film includes a lower portion located between the second electrode and the terminal electrode. The first insulating film includes an upper portion located on the second electrode and the terminal electrode. The second protective film covers the upper portion of the first insulating film and includes silicon and nitrogen.

According to one embodiment, a semiconductor device has a cell region and a terminal region set in the device, the terminal region surrounding the cell region, the device includes a first electrode, a semiconductor part, a terminal insulating film, a first protective film, a second electrode, a terminal electrode, a first insulating film, a second protective film, and a metal film. The semiconductor part is provided on the first electrode. The terminal insulating film is provided on the semiconductor part in the terminal region. The first protective film is provided on the terminal insulating film. The first protective film includes silicon and nitrogen. The second electrode is provided on the semiconductor part in the cell region. The second electrode includes an end portion located on the first protective film. The terminal electrode is provided on the first protective film in the terminal region and is connected to the semiconductor part. The first insulating film is provided on the first protective film, the first insulating film contacts the terminal electrode and the end portion of the second electrode. The first insulating film includes a lower portion located between the second electrode and the terminal electrode. The first insulating film includes an upper portion located higher than the second electrode and the terminal electrode. The second protective film covers the upper portion of the first insulating film and includes silicon and nitrogen. The metal film is provided on the first insulating film and is connected to the second electrode. The metal film includes a portion overlapping the terminal electrode and separated from the terminal electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions. In the specification and drawings, components similar to those described previously or illustrated in an antecedent drawing are marked with like reference numerals, and a detailed description is omitted as appropriate.

First Embodiment

Figure 2:
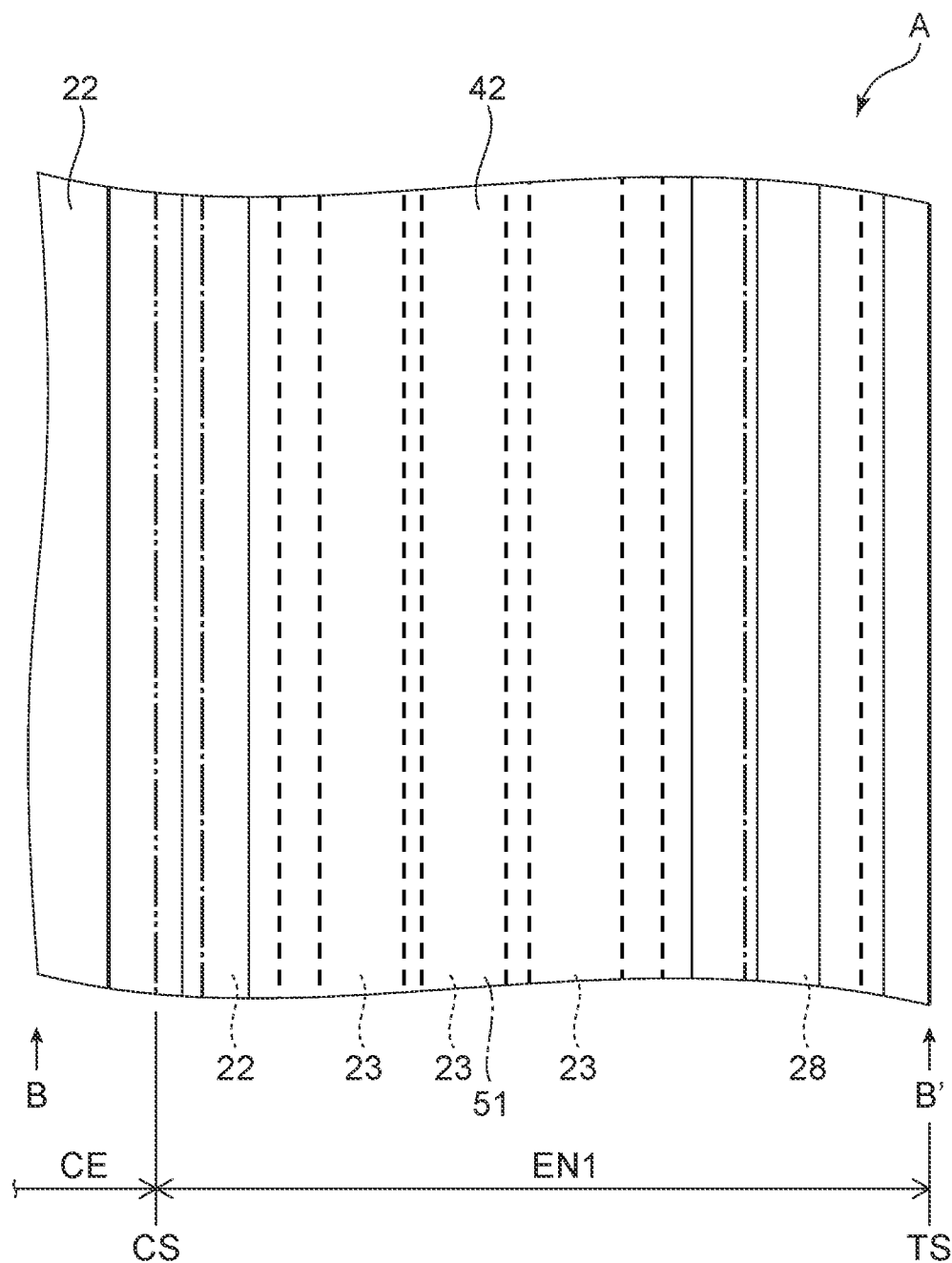
FIG. 2 is an enlarged view showing region A of FIG. 1.
Figure 3:
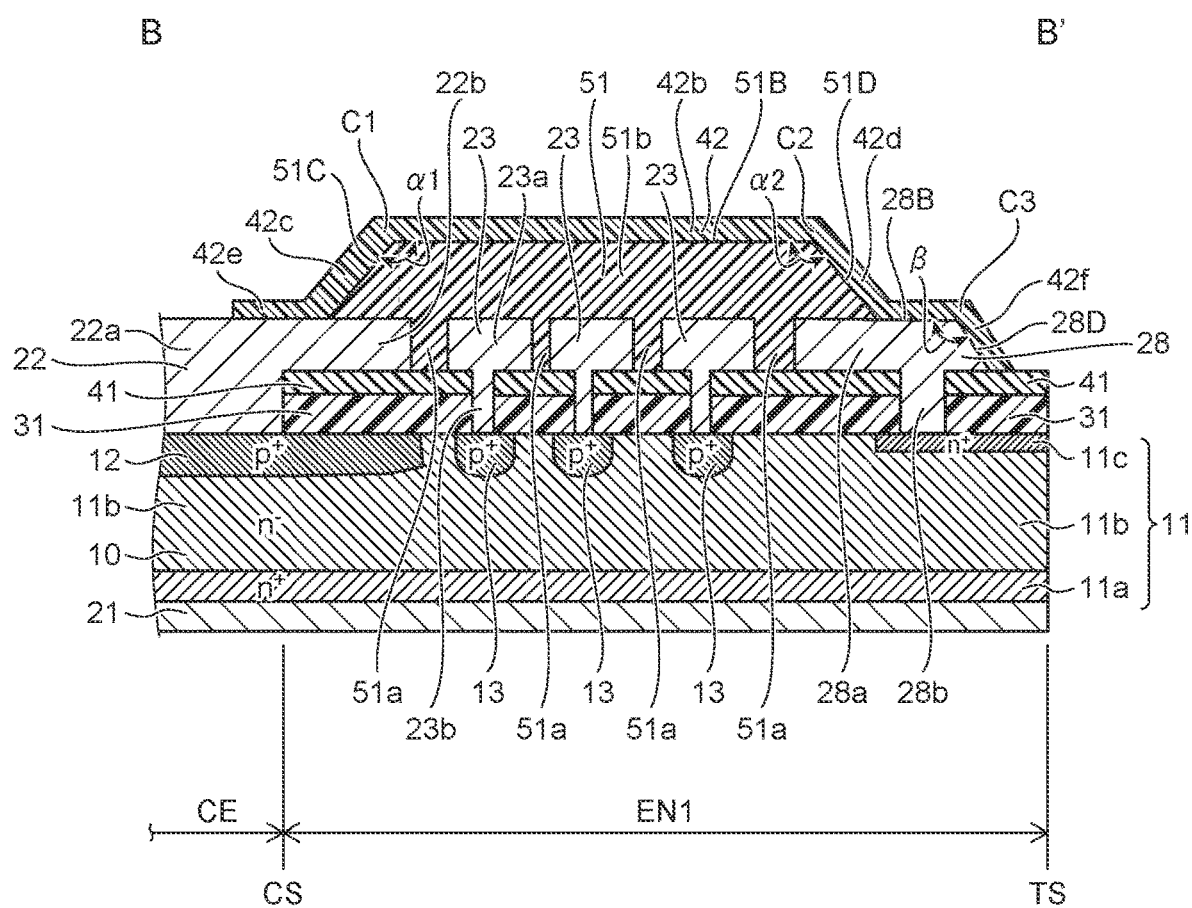
FIG. 3 is a cross-sectional view along line B-B' shown in FIG. 2.

FIG. 1 is a plan view showing a semiconductor device according to the embodiment. FIG. 2 is an enlarged view showing region A of FIG. 1. FIG. 3 is a cross-sectional view along line B-B' shown in FIG. 2. The interconnect layers are not illustrated in FIGS. 1 to 3. A first low-stress insulating film 51, which is described below, is illustrated by single dot-dash lines in FIGS. 1 and 2. Edge lines of a second protective film 42, which is described below, are illustrated by fine lines in FIG. 2.

For example, the semiconductor device 101 according to the embodiment is used to control a current supplied to a vehicle such as a railway car, etc.; and a voltage of several thousand V is applied to the semiconductor device 101. The semiconductor device 101 according to the embodiment is a power semiconductor device, e.g., a diode, through which a high current can flow, and that has high breakdown voltage performance even at high temperatures under high voltage.

In the semiconductor device 101 as shown in FIGS. 1 to 3, a cell region CE that controls the current is set, and a terminal region EN1 that is provided at the periphery of the cell region CE is set. As shown in FIGS. 1 and 2, the cell region CE is inward of the double dot-dash line, and the terminal region EN1 is outward of the double dot-dash line. In the terminal region EN1, the inner side, which is the cell region CE is referred to as a cell side CS; and the outer side, which is the dicing line, is referred to as a terminal side TS.

The semiconductor device 101 has a stacked structure and has a substantially rectangular parallelepiped shape. As shown in FIGS. 2 and 3, summarily, the semiconductor device 101 includes a semiconductor part 10, a first electrode 21, a second electrode 22, a third electrode 23, a terminal electrode 28, a terminal insulating film 31, a first protective film 41, the second protective film 42, and the first low-stress insulating film 51.

The first electrode 21 is provided at the entire bottom surface of the semiconductor device 101 and has a substantially flat plate shape. The first electrode 21 is, for example, a cathode electrode.

The semiconductor part 10 is provided on the first electrode 21 and has a substantially rectangular parallelepiped shape. As shown in FIG. 3, the semiconductor part 10 includes a first semiconductor layer 11, a second semiconductor layer 12, and a third semiconductor layer 13. The semiconductor part 10 includes, for example, silicon (Si) or silicon carbide (SiC).

The first semiconductor layer 11 is of a first conductivity type, e.g., an n-type. The first semiconductor layer 11 includes a lower layer semiconductor layer 11a, an upper layer semiconductor layer 11b, and a terminal semiconductor layer 11c. The lower layer semiconductor layer 11a is provided on the first electrode 21 in the cell region CE and the terminal region EN1 and contacts the first electrode 21. For example, the lower layer semiconductor layer 11a is made of an $n^+$-type semiconductor. The upper layer semiconductor layer 11b is provided on the lower layer semiconductor layer 11a in the cell region CE and the terminal region EN1. For example, the upper layer semiconductor layer 11b is made of an $n^-$-type semiconductor. The terminal semiconductor layer 11c is provided on the upper layer semiconductor layer 11b in the terminal region EN1 and is made of, for example, an $n^+$-type semiconductor. The "$n^-$-type" means that the carrier concentration is less than that of the "$n^+$-type". The terminal semiconductor layer 11c is formed in a frame shape surrounding the cell region CE when viewed in plan. The terminal semiconductor layer 11c is provided at the terminal side TS of the semiconductor device 101 and is located, for example, along the terminal side TS.

As shown in FIG. 3, the second semiconductor layer 12 is provided on the upper layer semiconductor layer 11b in the cell region CE; and a portion of the second semiconductor layer 12 at the terminal side TS is located in the terminal region EN1. The second semiconductor layer 12 is of a second conductivity type, e.g., a $p^+$-type. The second semiconductor layer 12 is, for example, an anode-side semiconductor layer and is connected to the second electrode 22 provided above the second semiconductor layer 12.

The third semiconductor layer 13 is, for example, a guard ring. Multiple, e.g., three third semiconductor layers 13 are provided on the upper layer semiconductor layer 11b in the terminal region EN1. The third semiconductor layer 13 is of the second conductivity type, e.g., the $p^+$-type. The third semiconductor layer 13 is connected to the third electrode 23 provided above the third semiconductor layer 13. When viewed in plan, the multiple third semiconductor layers 13 have substantially similarly-shaped frame shapes of different sizes that are located concentrically to surround the cell region CE.

The terminal insulating film 31 is provided on the semiconductor part 10 in the terminal region EN1 and contacts the upper surface of the semiconductor part 10. Specifically, the terminal insulating film 31 covers the region of the upper surface of the semiconductor part 10 other than the regions contacting the second electrode 22, the third electrodes 23, and the terminal electrode 28. Thereby, the terminal insulating film 31 has a substantially flat shape with substantially no steps or bent portions. The terminal insulating film 31 includes silicon and oxygen (O) and includes, for example, silicon oxide (SiO).

The first protective film 41 is provided on the terminal insulating film 31 and covers the upper surface of the terminal insulating film 31. Thereby, the first protective film 41 has a substantially flat shape with substantially no steps or bent portions. The first protective film 41 includes silicon and nitrogen (N) and includes, for example, silicon nitride (SiN).

As shown in FIGS. 1 to 3, the second electrode 22 is provided on the semiconductor part 10 in the cell region CE and at the cell side CS of the terminal region EN1. The second electrode 22 is, for example, an anode electrode. The second electrode 22 includes, for example, aluminum (Al). As shown in FIG. 3, the second electrode 22 includes a main portion 22a and an end portion 22b. The main portion 22a is provided on the second semiconductor layer 12 in the cell region CE; and the lower surface of the main portion 22a is connected to the second semiconductor layer 12. A side surface at the terminal side TS of the main portion 22a contacts a side surface at the cell side CS of the terminal insulating film 31 and a side surface at the cell side CS of the first protective film 41 in the terminal side TS.

The end portion 22b juts from the upper portion of the main portion 22a toward the terminal side TS. The end portion 22b is located on the first protective film 41 at the cell side CS of the terminal region EN1; and the lower surface of the end portion 22b contacts the first protective film 41.

As shown in FIGS. 1 and 2, the multiple third electrodes 23 have multiple substantially frame shapes provided concentrically in the terminal region EN1 to surround the cell region CE. As shown in FIG. 3, the third electrode 23 includes a main portion 23a and a contact portion 23b. The main portion 23a is provided on the first protective film 41. The lower surface of the main portion 23a contacts the first protective film 41. The contact portion 23b extends downward from the main portion 23a, is provided on the third semiconductor layer 13, and is connected to the third semiconductor layer 13. The contact portion 23b extends through the terminal insulating film 31 and the first protective film 41. The third electrode 23 includes, for example, aluminum.

As shown in FIGS. 1 and 2, the terminal electrode 28 is substantially frame-shaped and surrounds the cell region CE in the terminal region EN1. As shown in FIG. 3, the terminal electrode 28 includes a main portion 28a and a contact portion 28b.

The main portion 28a is provided on the first protective film 41. The lower surface of the main portion 28a contacts the first protective film 41. As shown in FIG. 3, it is favorable for an angle β between an upper surface 28B of the terminal electrode 28 and a side surface 28D of the main portion 28a facing the terminal side TS to be, for example, not less than 100 degrees. The contact portion 28b extends downward from the main portion 28a, is provided on the terminal semiconductor layer 11c, and is connected to the terminal semiconductor layer 11c. The contact portion 28b extends through the terminal insulating film 31 and the first protective film 41. The terminal electrode 28 includes, for example, aluminum.

As shown in FIGS. 1 and 2, the first low-stress insulating film 51 is provided in a substantially frame shape surrounding the cell region CE. As shown in FIG. 3, the first low-stress insulating film 51 includes a lower portion 51*a* and an upper portion 51*b*. The lower portion 51*a* is provided on the first protective film 41 and located between the second electrode 22 and the terminal electrode 28. Specifically, the lower portion 51*a* is provided in the gaps of the second electrode 22, the multiple third electrodes 23, and the terminal electrode 28 and contacts the end portion 22*b* of the second electrode 22, the main portions 23*a* of the multiple third electrodes 23, and the side surface of the main portion 28*a* of the terminal electrode 28.

The upper portion 51*b* is provided on the lower portion 51*a* and located on the second electrode 22, the third electrodes 23, and the terminal electrode 28. The upper portion 51*b* contacts the upper surface of the end portion 22*b* of the second electrode 22, the upper surfaces of the main portions 23*a* of the third electrodes 23, and the upper surface 28B of the cell side CS of the main portion 28*a* of the terminal electrode 28. In other words, the first low-stress insulating film 51 covers the end portion 22*b* of the second electrode 22 and the end portion of the cell side CS of the terminal electrode 28.

It is sufficient for the first low-stress insulating film 51 to contact at least the side surface of the end portion 22*b* of the second electrode 22 and the side surface of the cell side CS of the terminal electrode 28.

The upper portion 51*b* includes an upper surface 51B, and side surfaces 51C and 51D that contact the upper surface 51B. The upper surface 51B is, for example, a flat surface.

The side surface 51C is positioned at the cell side CS; and the side surface 51D is positioned at the terminal side TS. It is favorable for an angle $\alpha 1$ between the side surface 51C and the upper surface 51B of the upper portion 51*b* to be, for example, not less than 100 degrees. It is favorable for an angle $\alpha 2$ between the side surface 51D and the upper surface 51B of the upper portion 51*b* to be, for example, not less than 100 degrees.

The first low-stress insulating film 51 (a first insulating film) includes silicon, oxygen, nitrogen, and hydrogen (H) and includes, for example, silicon oxynitride (SiON) and hydrogen. The first low-stress insulating film 51 includes more hydrogen and less nitrogen than the first protective film 41, which includes silicon nitride. The first low-stress insulating film 51 has high breakdown voltage performance due to low amounts of bonded substances of silicon oxide and hydrogen (SiO—H). The first low-stress insulating film 51 has a longer life in a high electric field than the first and second protective films 41 and 42. Because the first low-stress insulating film 51 has a higher breakdown electric field than the first and second protective films 41 and 42, the insulation property can be maintained even in a high electric field. For example, the first low-stress insulating film 51 has an internal stress of not more than 10 MPa. The internal stress of the first low-stress insulating film 51 is less than the internal stresses of the first protective film 41 and the terminal insulating film 31. For example, the internal stress of the first low-stress insulating film 51 is not more than 1/40 of the internal stress of the first protective film 41. Thus, the thick first low-stress insulating film 51 is an insulating film that has high breakdown voltage performance and a high insulation property even under a high electric field. On the other hand, ions penetrate the first low-stress insulating film 51 more easily than the first and second protective films 41 and 42, which include silicon nitride.

As shown in FIGS. 1 and 2, the second protective film 42 surrounds the cell region CE in a frame shape in the terminal region EN1; and a portion of the second protective film 42 at the cell side CS is provided in the cell region CE. As shown in FIG. 3, the second protective film 42 is provided on the first low-stress insulating film 51. The second protective film 42 covers the side surfaces 51C and 51D and the upper surface 51B of the upper portion 51*b* of the first low-stress insulating film 51. The second protective film 42 includes an upper portion 42*b*, side portions 42*c* and 42*d*, and electrode contact portions 42*e* and 42*f*. The upper portion 42*b* contacts the upper surface of the upper portion 51*b* of the first low-stress insulating film 51. The side portion 42*c* is provided at the cell side CS of the upper portion 42*b* and contacts the side surface 51C of the first low-stress insulating film 51. The side portion 42*d* is provided at the terminal side TS of the upper portion 42*b* and contacts the side surface 51D of the first low-stress insulating film 51. The angle between the inner surfaces of the side portion 42*c* and the upper portion 42*b* of the second protective film 42 is substantially equal to the angle $\alpha 1$; and the angle between the inner surfaces of the side portion 42*d* and the upper portion 42*b* of the second protective film 42 is substantially equal to the angle $\alpha 2$. As described above, it is favorable for the angle $\alpha 1$ and the angle $\alpha 2$ to be, for example, not less than 100 degrees.

The electrode contact portion 42*e* is provided at the cell side CS of the side portion 42*c* and provided on the end portion 22*b* of the second electrode 22. The electrode contact portion 42*e* contacts the upper surface of the end portion 22*b* of the second electrode 22 and is parallel to the upper surface of the end portion 22*b*. The angle between the inner surfaces of the electrode contact portion 42*e* and the side portion 42*c* is substantially equal to the angle $\alpha 1$.

The electrode contact portion 42*f* is provided at the terminal side TS of the side portion 42*d* and is provided on the main portion 28*a* of the terminal electrode 28. The electrode contact portion 42*f* contacts the first protective film 41 and the upper surface 28B and the side surface 28D of the terminal electrode 28. The angle between the inner surfaces of the electrode contact portion 42*f* is substantially equal to the angle $\beta$; for example, it is favorable for the angle between the inner surfaces of the electrode contact portion 42*f* to be not less than 100 degrees.

The second protective film 42 includes silicon and nitrogen. The second protective film 42 suppresses, with the first protective film 41, the penetration of ions. The second protective film 42 is, for example, a silicon nitride film, and it is favorable for the second protective film 42 to have the same composition as, for example, the first protective film 41.

As shown in FIG. 2, the first low-stress insulating film 51 is thicker than the terminal insulating film 31, the first protective film 41, and the second protective film 42. It is favorable for the thickness of the upper portion 51*b* to be, for example, not less than 5 sm. It is favorable for the thickness of the first low-stress insulating film 51 to be not more than about 40 times the thickness of the first protective film 41.

Although the angle between the inner surfaces of the upper portion 42*b* and the side portion 42*c* of the second protective film 42 and the angle between the inner surfaces of the upper portion 42*b* and the side portion 42*d* are set to be not less than 100 degrees by setting the angle $\alpha 1$ between the upper surface 51B and the side surface 51C of the first low-stress insulating film 51 and the angle $\alpha 2$ between the upper surface 51B and the side surface 51D to be not less than 100 degrees in the embodiment, these angles are not limited thereto; the angles may be not less than 90 degrees.

Similarly, although it is favorable for the angle β between the side surface 28D and the upper surface 28B of the terminal electrode 28 to be, for example, not less than 100 degrees, the angle is not limited thereto; the angle β may be not less than 90 degrees.

Although the semiconductor device 101 according to the embodiment is a diode, the semiconductor device 101 may be another high breakdown voltage semiconductor device, e.g., a high breakdown voltage semiconductor device such as an IGBT, a MOSFET, etc. In such a case, various structures of the cell region CE of the semiconductor device 101 are possible, and it is sufficient to apply the structure of the terminal side TS of the second electrode 22 to the electrode at the anode side.

Operations of the semiconductor device 101 according to the embodiment will now be described.

The semiconductor device 101 according to the embodiment is located in the sealing resin. The sealing resin is, for example, a thermosetting resin such as an epoxy resin or the like, a gel such as a silicone resin, etc.; and the sealing resin includes a silica filler.

In the off-state, for example, a positive potential from a power supply device is applied to the first electrode 21, which is the cathode electrode. For example, a negative potential from the power supply device is applied to the second electrode 22, which is the anode electrode. The terminal electrode 28 has substantially the same positive potential as the first electrode 21 because the terminal electrode 28 is connected to the first electrode 21 via the semiconductor part 10 that contacts the first electrode 21. Thereby, the cell side CS of the semiconductor part 10 in the terminal region EN1 has a negative potential. A depletion layer that is generated in the upper layer semiconductor layer 11b in the terminal region EN1 does not extend to the terminal side TS beyond the terminal semiconductor layer 11c.

On the other hand, when the temperature of the sealing resin becomes high due to the inflow of a large current in the on-state, mobile ions that are included in the sealing resin easily move. Negative mobile ions are attracted to the terminal semiconductor layer 11c side, which has a positive potential; and positive mobile ions are attracted from the terminal semiconductor layer 11c side to the cell side CS of the semiconductor part 10 in the terminal region EN1, which has a negative potential. Breakdown of the terminal region EN1 due to the penetration of mobile ions is suppressed because the second protective film 42 does not transmit ions. Also, mobile ions are separated a distance from the semiconductor part 10 in the terminal region EN1 by the second protective film 42 provided on the thick first low-stress insulating film 51; and a breakdown voltage decrease due to the mobile ions is effectively suppressed.

On the other hand, the internal stress of the second protective film 42 is high; therefore, for example, there is a possibility that cracks may occur in the bent portions where stress easily concentrates. In the second protective film 42, the angle between the inner surfaces of the upper portion 42b and the side portion 42c and the angle between the inner surfaces of the upper portion 42b and the side portion 42d are set to be, for example, not less than 100 degrees. The stress concentration at a corner C1 that links the upper portion 42b and the side portion 42c and a corner C2 that links the upper portion 42b and the side portion 42d is suppressed thereby, and the occurrence of cracks is suppressed.

Even if cracks occur in the corners C1 and C2, the mobile ions that penetrate into the first low-stress insulating film 51 via the cracks are impeded from passing through by the first protective film 41 at the lower portion 51a of the first low-stress insulating film 51. Because the first protective film 41 has a substantially flat shape in which steps or bent portions are substantially not formed, cracks occur less easily in the first protective film 41 than in the second protective film 42. Accordingly, even if mobile ions penetrate the first low-stress insulating film 51, the first protective film 41 suppresses the penetration of the mobile ions into the terminal insulating film 31 and the semiconductor part 10.

The second protective film 42 contacts the upper surface of the second electrode 22 and the upper surface 28B of the terminal electrode 28. The penetration of the mobile ions into the first low-stress insulating film 51 is further suppressed thereby. Also, the second protective film 42 covers the upper surface 28B and the side surface 28D of the terminal electrode 28 and further suppresses the penetration of mobile ions. The angle between the inner surfaces of the electrode contact portion 42f of the second protective film 42 is set to be, for example, not less than 100 degrees. The occurrence of cracks at a corner C3 of the electrode contact portion 42f is suppressed thereby, and the penetration of mobile ions is further suppressed. The tip of the electrode contact portion 42f of the second protective film 42 is located further toward the terminal side TS than the terminal electrode 28 and contacts the first protective film 41. A location that could become an entrance for mobile ions is sealed thereby.

A method for manufacturing the semiconductor device 101 according to the embodiment will now be described.

First, the semiconductor part 10 is formed by, for example, epitaxial growth. The first semiconductor layer 11, the second semiconductor layer 12, and the third semiconductor layer 13 are formed in the semiconductor part 10 by implanting impurities into the prescribed portions of the semiconductor part 10.

Then, the terminal insulating film 31 that is, for example, a silicon oxide film is formed in the terminal region EN1 on the semiconductor part 10. The terminal insulating film 31 is a substantially flat film in which steps or bent portions are substantially not formed because the terminal insulating film 31 is formed on the substantially flat upper surface of the semiconductor part 10.

Continuing, the first protective film 41 is formed on the terminal insulating film 31. The first protective film 41 is a substantially flat film because the first protective film 41 is formed on the substantially flat terminal insulating film 31. For example, the first protective film 41 is formed by chemical vapor deposition (CVD) using plasma. For example, a gas that includes silane ($SiH_4$) and a gas that includes ammonia ($NH_3$) are used for the first protective film 41. Specifically, a carrier gas of nitrogen and reactant gases of silane and ammonia are used in the plasma CVD.

Prescribed portions of the terminal insulating film 31 and the first protective film 41 are removed down to the upper surface of the semiconductor part 10 by, for example, etching; and a lower portion of the main portion 22a of the second electrode 22, the contact portions 23b of the third electrodes 23, and the contact portion 28b of the terminal electrode 28 are formed. Continuing, an upper portion of the main portion 22a and the end portion 22b of the second electrode 22, the main portion 23a of the third electrode 23, and the main portion 28a of the terminal electrode 28 are formed.

Continuing, the first low-stress insulating film 51 is formed between the second electrode 22 and the terminal electrode 28. For example, the first low-stress insulating film 51 is formed by plasma CVD. For example, a gas that includes silane is used for the first low-stress insulating film 51. Specifically, for example, a carrier gas of nitrogen and a reactant gas of nitrous oxide ($N_2O$) are used in the plasma CVD.

The first low-stress insulating film 51 is formed between the second electrode 22 and the terminal electrode 28 by plasma CVD. Because the first low-stress insulating film 51 is formed by CVD, the first low-stress insulating film 51 can be formed with high precision onto the second electrode 22, the third electrodes 23, and the terminal electrode 28 from the first protective film 41, which is at a different level.

Then, the upper surface 51B and the side surfaces 51C and 51D are formed in the first low-stress insulating film 51 by etching the first low-stress insulating film 51.

Continuing, the second protective film 42 is formed on the first low-stress insulating film 51, the second electrode 22, and the terminal electrode 28. For example, the second protective film 42 is formed by plasma CVD. A gas similar to that of the first protective film 41 is used for the second protective film 42.

The conductive first electrode 21 is formed on the semiconductor part 10.

Effects of the semiconductor device 101 according to the embodiment will now be described.

According to the semiconductor device 101 according to the embodiment, the terminal insulating film 31 that is, for example, a silicon oxide film is formed on the substantially flat upper surface of the semiconductor part 10; and the first protective film 41 that includes, for example, silicon nitride is formed on the terminal insulating film 31. Thereby, the first protective film 41 is a substantially flat film having few steps and is provided on the terminal insulating film 31. Thereby, the first protective film 41 can suppress the occurrence of cracks and can suppress the penetration of ions into the semiconductor part 10.

The first low-stress insulating film 51 is provided between the second electrode 22 and the terminal electrode 28 on the first protective film 41. In the first low-stress insulating film 51, the lower portion 51a is provided between the second electrode 22, the third electrodes 23, and the terminal electrode 28; and the upper portion 51b is provided on the second electrode 22, the third electrodes 23, and the terminal electrode 28. The internal stress in the first low-stress insulating film 51 is low. Thereby, the wafer does not deform easily even if the thickness of the upper portion 51b is set to be, for example, not less than 5 μm and not more than 40 times the thickness of the first protective film 41. Thereby, a thick insulating film can be provided in the terminal region EN1; the insulation property can be increased; the breakdown voltage decrease due to the mobile ions can be suppressed; and the reliability of the terminal region EN1 of the semiconductor device 101 can be increased.

Although the reliability of the semiconductor device 101 according to the embodiment is increased by increasing the thickness of the first low-stress insulating film 51 as described above, it is not practical to increase the thicknesses of the other films. For example, when the thickness of the first protective film 41 is increased, the internal stress in the first protective film 41, which includes, for example, silicon nitride, is high, and may cause deformation such as warp, etc., of the wafer. The terminal insulating film 31 is, for example, a silicon oxide film and has high breakdown voltage performance; therefore, if the terminal insulating film 31 is formed to be thick, a high stress is generated between the terminal insulating film 31 and the semiconductor part 10, which includes silicon and contacts the terminal insulating film 31. Also, fine patterning by etching or the like of a thick terminal insulating film 31 is difficult, and the patternability is poor.

According to the semiconductor device 101 according to the embodiment, the second protective film 42 covers the upper portion 51b of the first low-stress insulating film 51 and suppresses the penetration of mobile ions into the first low-stress insulating film 51. The first low-stress insulating film 51, which contacts the second electrode 22 at the cell side CS and contacts the terminal electrode 28 at the terminal side TS, is covered with the flat first protective film 41 provided under the first low-stress insulating film 51 and the second protective film 42 provided on the first low-stress insulating film 51; therefore, the reliability can be increased by providing a thick insulating film in the terminal region EN1.

The angle between the inner surfaces of the upper portion 42b and the side portion 42c of the second protective film 42 and the angle between the inner surfaces of the upper portion 42b and the side portion 42d are set to be not less than 100 degrees by setting the angle between the side surface 51C and the upper surface 51B and the angle between the side surface 51D and the upper surface 51B of the upper portion 51b of the first low-stress insulating film 51 to be not less than 100 degrees. The occurrence of cracks at the corner C1 between the upper portion 42b and the side portion 42c and the corner C2 between the upper portion 42b and the side portion 42d where internal stress easily concentrates can be suppressed thereby; and the penetration of mobile ions through cracks can be suppressed.

The angle between the inner surfaces of the electrode contact portion 42f of the second protective film 42 is set to be not less than 100 degrees by setting the angle β between the upper surface 28B and the side surface 28D of the terminal electrode 28 to be not less than 100 degrees. The occurrence of cracks in the corner C3 of the electrode contact portion 42f is suppressed thereby.

The electrode contact portion 42f of the second protective film 42 contacts the upper surface 28B and the side surface 28D of the terminal electrode 28. Also, the tip of the electrode contact portion 42f of the second protective film 42 contacts the first protective film 41 at the terminal side TS of the terminal electrode 28. Thus, the penetration of attracted negative mobile ions can be effectively suppressed.

Second Embodiment

In a semiconductor device 102 according to the embodiment, one fourth semiconductor layer 14 is provided instead of the multiple third semiconductor layers 13 in the semiconductor part 10 in a terminal region EN2; and the semiconductor device 102 includes a metal film 61, a metal member 62, and a second low-stress insulating film 52 (a second insulating film). The second low-stress insulating film 52 includes silicon, oxygen, nitrogen, and hydrogen and includes, for example, silicon oxynitride and hydrogen. The second low-stress insulating film 52 includes more hydrogen and less nitrogen than the first protective film 41 or the second protective film 42, which include silicon nitride.

Figure 4:
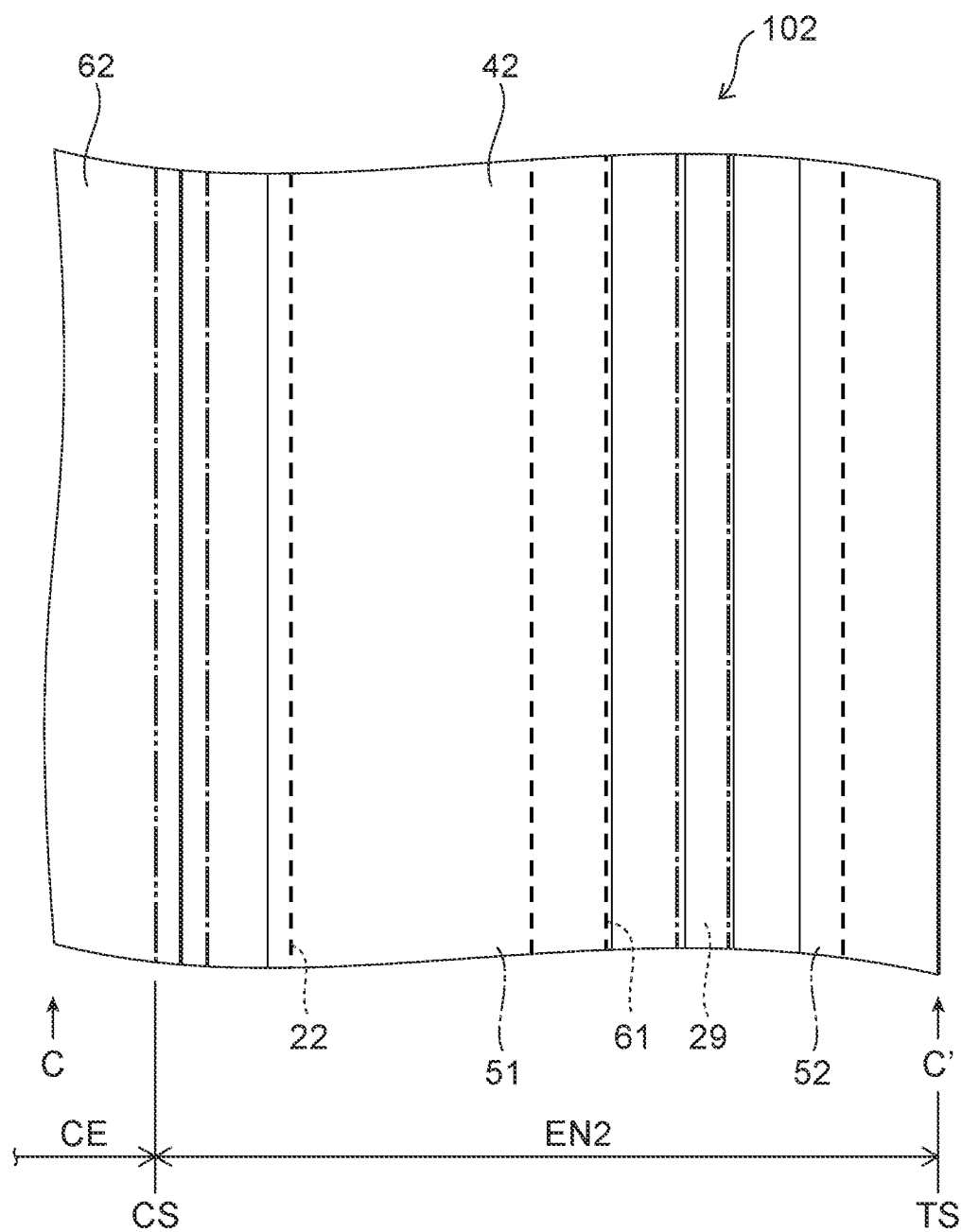
FIG. 4 is an enlarged plan view showing a semiconductor device of a second embodiment.
Figure 5:
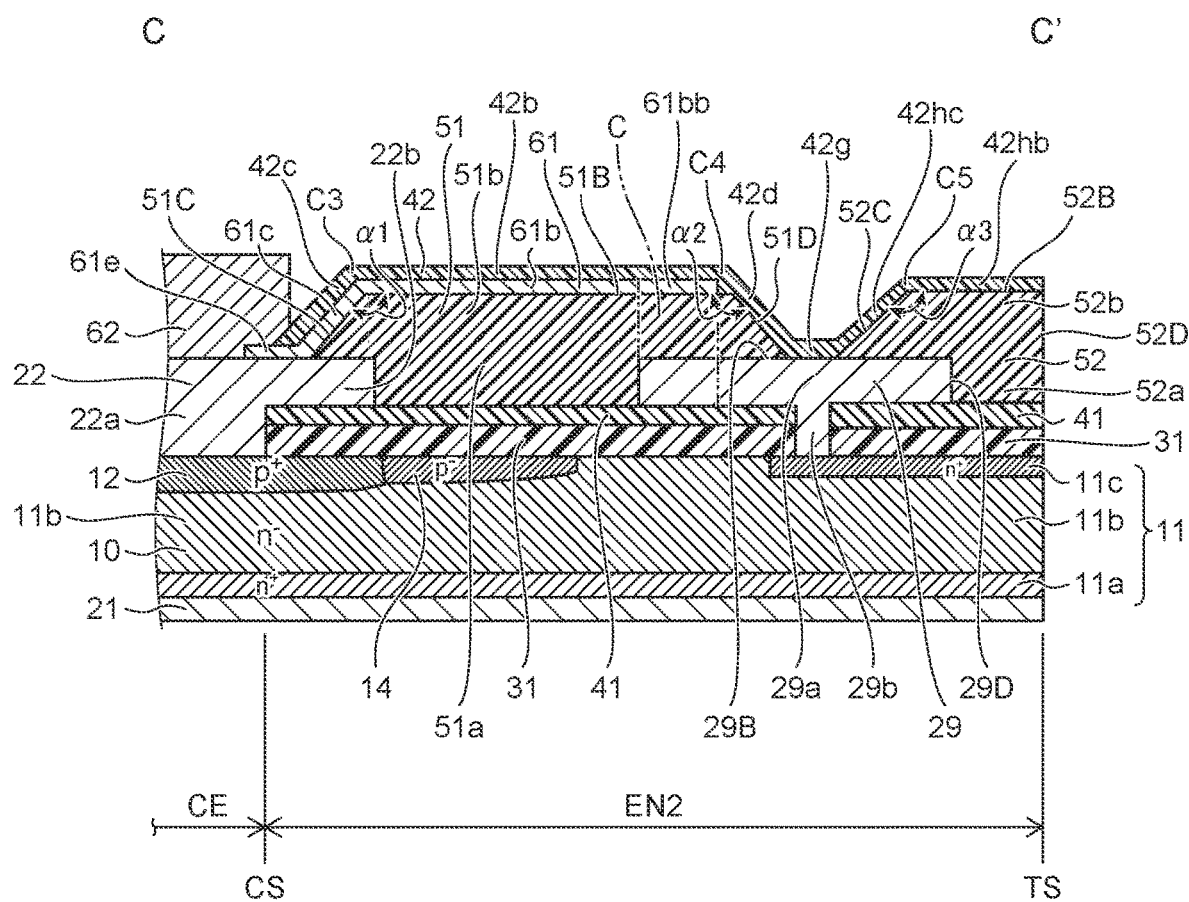
FIG. 5 is a cross-sectional view along line C-C' shown in FIG. 4.

FIG. 4 is an enlarged plan view showing the semiconductor device of the embodiment. FIG. 5 is a cross-sectional view along line C-C' shown in FIG. 4. In FIG. 4, edge lines of the second protective film 42 are illustrated by fine lines, and the first low-stress insulating film 51 and the second low-stress insulating film 52, which are described below, are illustrated by single dot-dash lines. The interconnect layers are not illustrated in FIGS. 4 and 5.

As shown in FIG. 5, the semiconductor part 10 includes the first semiconductor layer 11, the second semiconductor layer 12, and the fourth semiconductor layer 14.

The fourth semiconductor layer 14 is, for example, a RESURF (Reduced Surface Field). The fourth semiconductor layer 14 is provided on the upper layer semiconductor layer 11b in the terminal region EN2. The fourth semiconductor layer 14 is provided at the terminal side TS of the second semiconductor layer 14 and is in contact with the second semiconductor layer 12. The fourth semiconductor layer 14 is of the second conductivity type and is made of, for example, a p$^-$-type semiconductor. The fourth semiconductor layer 14 has substantially the same potential as the second semiconductor layer 12, e.g., about 0 V. Similarly to the second semiconductor layer 12, the fourth semiconductor layer 14 has a substantially frame shape surrounding the cell region CE.

The terminal insulating film 31 covers the region of the semiconductor part 10 other than the region of the semiconductor part 10 that contacts the second electrode 22 and a terminal electrode 29. The terminal insulating film 31 contacts the terminal semiconductor layer 11c from the terminal electrode 29 to the terminal side TS.

The angle between an upper surface 29B and a side surface 29D of a main portion 29a of the terminal electrode 29 is about 90 degrees.

The lower portion 51a of the first low-stress insulating film 51 is located between the second electrode 22 and the terminal electrode 29. The lower surface of the lower portion 51a of the first low-stress insulating film 51 contacts the first protective film 41; and the side surface of the lower portion 51a contacts the side surface of the end portion 22b of the second electrode 22 and the side surface at the cell side CS of the main portion 29a of the terminal electrode 29.

The upper portion 51b of the first low-stress insulating film 51 contacts the upper surface of the end portion 22b of the second electrode 22 and the upper surface of the main portion 29a of the terminal electrode 29. The relative dielectric constant of the first low-stress insulating film 51 is 4.8.

For example, the metal film 61 has a substantially frame shape surrounding the cell region CE. The metal film 61 includes an upper portion 61b, a side portion 61c, and an electrode contact portion 61e. The upper portion 61b contacts the upper surface 51B of the first low-stress insulating film 51. The side portion 61c is provided at the cell side CS of the upper portion 61b and contacts the side surface 51C of the first low-stress insulating film 51. The electrode contact portion 61e is provided at the cell side CS of the side portion 61c and contacts the upper surface of the main portion 22a of the second electrode 22. The angle between the inner surfaces of the upper portion 61b and the side portion 61c of the metal film 61 and the angle between the inner surfaces of the side portion 61c and the electrode contact portion 61e of the metal film 61 are substantially equal to the angle $\alpha1$. For example, the metal film 61 is made of a metal including copper (Cu).

A tip portion 61bb of the upper portion 61b overlaps the main portion 29a of the terminal electrode 29 and is separated from the main portion 29a. The upper portion 51b of the first low-stress insulating film 51 is interposed in the gap between the tip portion 61bb of the metal film 61 and the main portion 29a of the terminal electrode 29. Thereby, the tip portion 61bb of the metal film 61 and the main portion 29a of the terminal electrode 29 function as a capacitor C that is connected in parallel with the second electrode 22 and the first electrode 21. The tip portion 61bb of the metal film 61 does not protrude from the upper surface 51B of the first low-stress insulating film 51 and is located at the surface of the upper surface 51B.

The portion of the metal film 61 that is included in the capacitor C may be a portion other than the tip portion 61bb. The capacitor C may include a middle portion of the metal film 61 by further extending the metal film 61.

For example, the second low-stress insulating film 52 has a substantially frame shape surrounding the cell region CE and is provided at the terminal side TS of the first low-stress insulating film 51. The second low-stress insulating film 52 includes a lower portion 52a and an upper portion 52b. The lower portion 52a is provided on the first protective film 41, is located at the terminal side TS of the terminal electrode 29, and contacts the side surface of the main portion 29a.

The upper portion 52b is provided on the main portion 29a of the terminal electrode 29. The upper portion 52b is separated from the upper portion 51b of the first low-stress insulating film 51 at the upper surface 29B of the terminal electrode 29. The upper portion 52b includes an upper surface 52B, a side surface 52C that contacts the upper surface 52B at the cell side CS, and a side surface 52D at the terminal side TS. It is favorable for an angle $\alpha3$ between the side surface 52C and the upper surface 52B of the upper portion 52b to be, for example, not less than 100 degrees. The angle between the side surface 52D and the upper surface 52B of the upper portion 52b is, for example, about 90 degrees. The angle between the side surface 52C of the upper portion 52b and the upper surface 29B of the terminal electrode 29 is substantially equal to the angle $\alpha3$.

As shown in FIG. 5, the second low-stress insulating film 52 is thicker than the terminal insulating film 31, the first protective film 41, and the second protective film 42. It is favorable for the thickness of the upper portion 52b to be, for example, not less than 5 μm. Also, it is favorable for the second low-stress insulating film 52 to be not more than about 40 times the thickness of the first protective film 41.

The second low-stress insulating film 52 includes substantially the same substance as the first low-stress insulating film 51, is made of substantially the same composition as, for example, the first low-stress insulating film 51, and has the same features.

The second protective film 42 is provided over the first low-stress insulating film 51 and over the second low-stress insulating film 52. The second protective film 42 includes the upper portion 42b and the side portions 42c and 42d that are provided on the first low-stress insulating film 51, an electrode contact portion 42g that contacts the terminal electrode 29, and an upper portion 42hb and a side portion 42hc that are provided on the second low-stress insulating film 52. The vicinity of a corner C4 between the upper portion 42b and the side portion 42d contacts the tip portion 61bb of the upper portion 61b of the metal film 61 and the terminal side TS of the upper surface 51B of the first low-stress insulating film 51.

The electrode contact portion 42g contacts the upper surface 29B of the terminal electrode 29. The side portion 42hc contacts the side surface 52C of the second low-stress insulating film 52. The upper portion 42hb contacts the upper surface 52B of the second low-stress insulating film 52. The angle between the inner surfaces of the side portion 42d and the electrode contact portion 42g is substantially equal to the angle $\alpha2$. The angle between the inner surfaces of the upper portion 42hb and the side portion 42hc is substantially equal to the angle α3, and it is favorable for the angle between the inner surfaces of the upper portion 42*hb* and the side portion 42*hc* to be not less than 100 degrees. The angle between the inner surfaces of the side portion 42*hc* and the electrode contact portion 42*g* is substantially equal to the angle α3.

The film thickness of the electrode contact portion 42*g* of the second protective film 42 is greater than the thicknesses of the other portions of the second protective film 42. The relative dielectric constant of the second protective film 42 is 7.0.

The metal member 62 has a substantially rectangular parallelepiped shape and includes copper. For example, the metal member 62 has a substantially frame shape surrounding the cell region CE. The metal member 62 is provided on the second electrode 22 and is connected to the electrode contact portion 61*e* of the metal film 61. Specifically, the metal member 62 is provided at the upper surface of the main portion 22*a* of the second electrode 22 where the electrode contact portion 61*e* of the metal film 61 is located. The upper surface of the metal member 62 is positioned slightly higher than the upper portions 42*b* and 42*hb* of the second protective film 42.

The metal member 62 also can be used in the configuration of the first embodiment. For example, the metal film 61 may not be provided on the first low-stress insulating film 51; and the metal member 62 may not connect the metal film 61.

Operations of the semiconductor device 102 according to the embodiment will now be described.

The semiconductor device 102 according to the embodiment is located in a sealing resin; the lower surface of the first electrode 21 is connected to a substrate; and the upper surface of the metal member 62 is connected to a substrate. Thereby, the semiconductor device 102 dissipates heat from the first electrode 21 and the metal member 62. The semiconductor device 102 receives a load from the substrate between the first electrode 21 and the metal member 62.

The semiconductor device 102 is a high-speed power semiconductor; therefore, the accumulated carrier amount is low. Accordingly, for example, there are cases where the carriers abruptly decrease when switching off, and an electrical oscillation occurs in the terminal electrode 29, the first electrode 21 at the cathode side, and the second electrode 22 at the anode side in reverse recovery. Conversely, the capacitor C absorbs the electrical oscillations of the terminal electrode 29, the first electrode 21, and the second electrode 22 and reduces the effects to the outside.

The side portion 42*d*, the electrode contact portion 42*g*, and the side portion 42*hc* of the second protective film 42, the first low-stress insulating film 51, and the second low-stress insulating film 52 suppress discharge from the tip of the tip portion 61*bb* of the metal film 61. The thick electrode contact portion 42*g* that contacts the terminal electrode 29 also effectively suppresses the discharge.

For example, the fourth semiconductor layer 14, which is a RESURF, is depleted when it is in the off-state and suppresses the concentration of the electric field in the terminal region EN2 in the off-state.

Similarly to the first embodiment, the semiconductor device 102 is located in a sealing resin. The penetration into the first low-stress insulating film 51 and the second low-stress insulating film 52 of the mobile ions in the sealing resin is suppressed by the second protective film 42. Also, the mobile ions are separated from the semiconductor part 10 and the terminal insulating film 31 by the thick first low-stress insulating film 51 and the thick second low-stress insulating film 52 that are covered with the second protective film 42.

The metal film 61 effectively suppresses the penetration of mobile ions because the metal film 61 does not transmit the mobile ions. Even if cracks occur in the corner C3 of the second protective film 42, the penetration of mobile ions is suppressed by the metal film 61, which is at the inner side of the corner C3, because the metal film 61 is provided between the first low-stress insulating film 51 and the second protective film 42.

Only differences with respect to the first embodiment will be described for the method for manufacturing the semiconductor device 102 according to the embodiment.

For example, similarly to the first embodiment, the first low-stress insulating film 51 and the second low-stress insulating film 52 are formed by plasma CVD on the second electrode 22, the terminal electrode 29, and the first protective film 41.

For example, the metal film 61 is formed on the first low-stress insulating film 51 by sputtering.

For example, the metal member 62 is formed by overlaying plating of a metal including copper.

Effects of the semiconductor device 102 according to the embodiment will now be described.

According to the semiconductor device 102 according to the embodiment, the metal film 61 is provided on the first low-stress insulating film 51; and the tip portion 61*bb* of the metal film 61 overlaps and is separated from the main portion 29*a* of the terminal electrode 29 above the main portion 29*a*. The electrode contact portion 61*e* of the metal film 61 is connected to the second electrode 22. Thereby, the tip portion 61*bb* of the metal film 61 and the main portion 29*a* of the terminal electrode 29 have the upper portion 51*b* of the first low-stress insulating film 51 interposed and are included in a capacitor C that is connected in parallel with the second electrode 22 and the first electrode 21. Accordingly, the capacitor C can absorb electrical oscillations of the second electrode 22 and the terminal electrode 29 in reverse recovery when switching off. Thereby, an inexpensive and highly reliability capacitor C can be embedded in the semiconductor device 102.

The thick second low-stress insulating film 52 is provided at the terminal side of the first low-stress insulating film 51 and is located on the first protective film 41 and on the terminal electrode 29. The second protective film 42 is provided over the first low-stress insulating film 51, the upper surface 29B of the terminal electrode 29, and the second low-stress insulating film 52. Thereby, a thick insulating film is located also at the terminal in the sealing resin where the negative mobile ions easily concentrate; the breakdown voltage decrease is effectively suppressed; and the penetration of mobile ions is suppressed.

The second protective film 42, the first low-stress insulating film 51, and the second low-stress insulating film 52 suppress the discharge from the tip portion 61*bb* of the metal film 61 to the terminal electrode 29.

The metal member 62 is provided on the second electrode 22. The upper surface of the metal member 62, which has a substantially rectangular parallelepiped shape, is positioned higher than the second protective film 42. Thereby, the metal member 62 makes the thicknesses inside the semiconductor device 102 uniform and relaxes the occurrence of stress in the semiconductor device 102. Also, the portions of the metal member 62, the second electrode 22, the semiconductor part 10, and the first electrode 21 that overlap have high strength and can receive a load from the outside; and breakdown of the semiconductor device 102 due to an external load can be suppressed. The metal member 62 and the first electrode 21 can improve the heat dissipation by being connected to a substrate for heat dissipation.

Configurations, operations, and effects other than those described above in the present embodiment are the same as those in the first embodiment.

Third Embodiment

A semiconductor device 103 according to the embodiment is an IGBT. In the semiconductor device 103, a cell region CE3 is different from the cell region CE of the semiconductor device 101 according to the first embodiment, but a terminal region EN3 is substantially the same as the terminal region EN1 of the semiconductor device 101.

Figure 6:
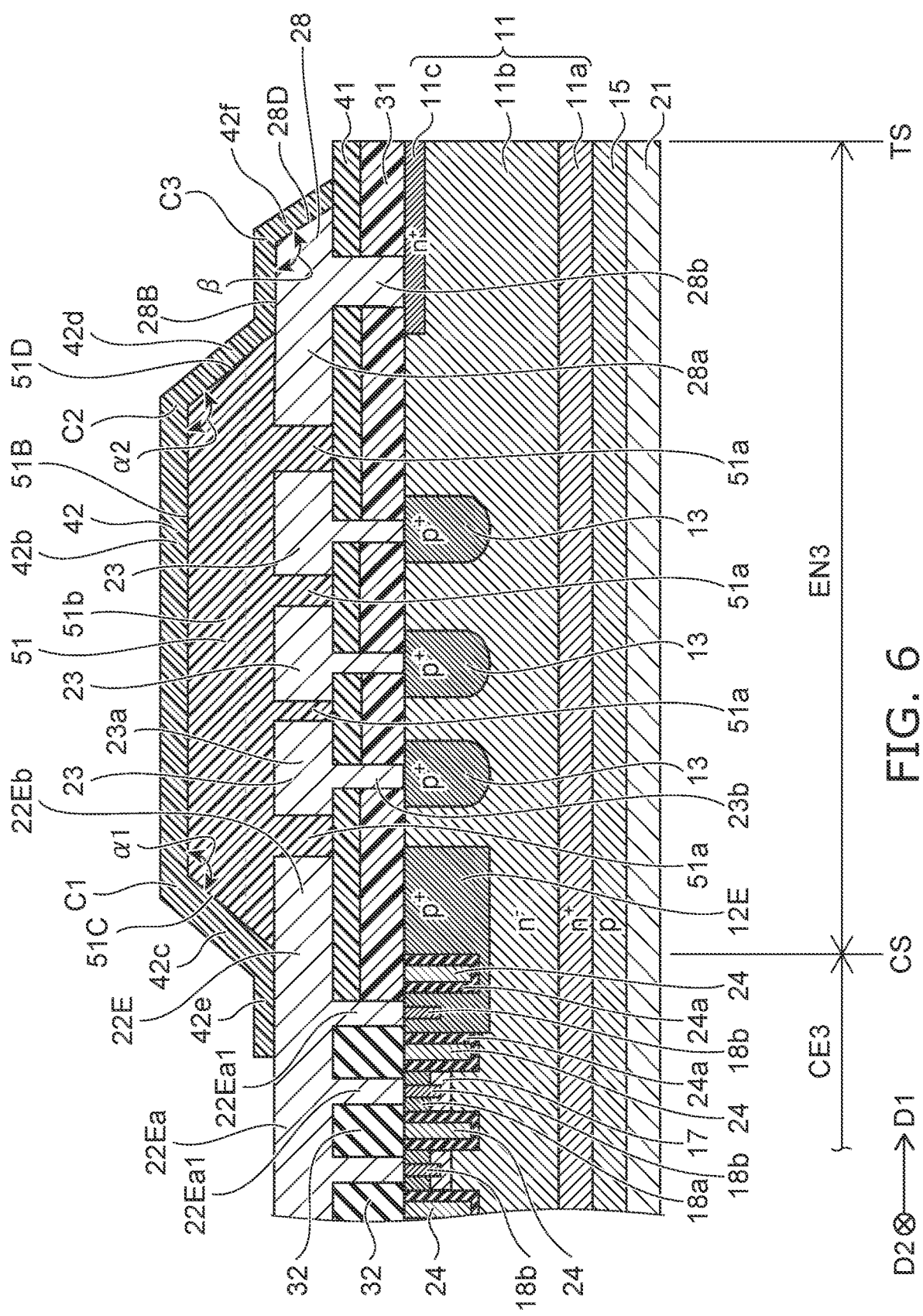
FIG. 6 is an enlarged cross-sectional view showing a semiconductor device according to a third embodiment.

FIG. 6 is an enlarged cross-sectional view showing the semiconductor device 103 according to the embodiment. FIG. 6 is a cross-sectional view of a location equivalent to FIG. 3, and the interconnect layers are not illustrated.

In the cell region CE3 and the terminal region EN3 of the semiconductor device 103 as shown in FIG. 6, a fifth semiconductor layer 15 is provided on the first electrode 21; and the lower layer semiconductor layer 11a is provided on the fifth semiconductor layer 15. The fifth semiconductor layer 15 is of the second conductivity type and is made of, for example, a p-type semiconductor.

In the cell region CE3, the semiconductor device 103 further includes a plurality of each of a channel layer 17, an emitter layer 18a, an emitter contact layer 18b, an insulating layer 32, a gate electrode 24, and a gate insulating film 24a.

The first electrode 21 is, for example, a collector electrode and is connected to, for example, the positive side of a power supply device in the off-state. A prescribed voltage for performing current control is applied to the gate electrode 24. A second electrode 22E is, for example, an emitter electrode. For example, the second electrode 22E is connected to the negative side of the power supply device in the off-state. The second electrode 22E includes a main portion 22Ea provided on the semiconductor part 10, and an end portion 22Eb positioned at the terminal side TS of the main portion 22Ea. The main portion 22Ea includes a contact portion 22Ea1 extending downward at the lower surface of the main portion 22Ea. The contact portion 22Ea1 contacts the emitter contact layer 18b. The end portion 22Eb is provided on the first protective film 41 at the cell side CS of the terminal region EN3. The first low-stress insulating film 51 and the second protective film 42 are provided on the end portion 22Eb. The second protective film 42 is provided on the main portion 22Ea.

As shown in FIG. 6, the emitter contact layer 18b and the gate electrode 24 are alternately arranged along an arrangement direction D1 toward the terminal side TS and extend along an extension direction D2 orthogonal to the arrangement direction D1.

The channel layer 17 is made of, for example, a p-type semiconductor; and the emitter layer 18a is made of, for example, an n-type semiconductor. The emitter contact layer 18b is made of, for example, a p+ semiconductor and extends downward at the channel layer 17 and the emitter layer 18a, which are stacked. Other than the upper surface of the gate electrode 24, the gate electrode 24 is covered with the gate insulating film 24a. The gate electrode 24 that is located at the terminal side TS faces a second semiconductor layer 12E via the gate insulating film 24a. The other gate electrodes 24 face, via the gate insulating films 24a, the upper layer semiconductor layer 11b, the channel layers 17, and the emitter layers 18a, which are stacked. The insulating layer 32 is provided between the second electrode 22E and the gate electrode 24.

According to the semiconductor device 103 according to the embodiment, even when the semiconductor device 103 is, for example, an IGBT, terminal structures similar to those of the semiconductor device 101 according to the first embodiment and the semiconductor device 102 according to the second embodiment can be employed by providing the main portion 22Ea of the second electrode 22E on the semiconductor part 10 and by providing the end portion 22Eb of the second electrode 22E on the first protective film 41 in the terminal region EN3; and the reliability of the semiconductor device 103 can be increased.

Configurations, operations, and effects other than those described above in the present embodiment are the same as those in the first embodiment.

According to embodiments of the invention, a semiconductor device that has high reliability can be provided.

Hereinabove, embodiments of the invention are described with reference to specific examples. However, the embodiments of the invention are not limited to these specific examples. For example, one skilled in the art may similarly practice the invention by appropriately selecting specific configurations of the cell region and the terminal region, specific configurations, material properties, and the like of the electrodes, the semiconductor layers of the semiconductor part, and the like included in the semiconductor device from known art; and such practice is within the scope of the invention to the extent that similar effects can be obtained. Combinations of any two or more components of the specific examples within the extent of technical feasibility also is within the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention includes the following aspects.

Note 1

A semiconductor device having a cell region and a terminal region set in the device, the terminal region surrounding the cell region, the device comprising:

a first electrode;

a semiconductor part provided on the first electrode;

a terminal insulating film provided on the semiconductor part in the terminal region;

a first protective film provided on the terminal insulating film, the first protective film including silicon and nitrogen;

a second electrode provided on the semiconductor part in the cell region, the second electrode including an end portion located on the first protective film;

a terminal electrode provided on the first protective film in the terminal region and connected to the semiconductor part;

a first low-stress insulating film provided on the first protective film, the first low-stress insulating film including hydrogen and contacting the terminal electrode and the end portion of the second electrode, the internal stress of the first low-stress insulating film being less than the internal stress of the terminal insulating film, the first low-stress insulating film including a lower portion located between the second electrode and the terminal electrode, the first low-stress insulating film including an upper portion located on the second electrode and the terminal electrode; and a second protective film covering the upper portion of the first low-stress insulating film and including silicon and nitrogen.

Note 2

The device according to note 1, wherein
the first low-stress insulating film further includes silicon, oxygen, and nitrogen.

Note 3

The device according to Note 1 or 2, wherein
the second protective film contacts the terminal electrode.

Note 4

The device according to any one of Notes 1 to 3, wherein
the second protective film contacts the first protective film at a terminal side of the terminal electrode.

Note 5

The semiconductor device according to Note 4, wherein
an angle between an upper surface of the terminal electrode and a side surface at a terminal side of the terminal electrode is not less than 100 degrees.

Note 6

The semiconductor device according to any one of Notes 1 to 5, wherein
an angle between a side surface and an upper surface of the upper portion of the first low-stress insulating film is not less than 100 degrees.

Note 7

The device according to any one of Notes 1 to 6, wherein
the second protective film contacts the second electrode.

Note 8

The device according to any one of Notes 1 to 7, further comprising:
a metal film provided on the first low-stress insulating film and connected to the second electrode,
the metal film including a portion that overlaps the terminal electrode and is separated from the terminal electrode,
the semiconductor part including
a first semiconductor layer connected to the first electrode and the terminal electrode, the first semiconductor layer being of a first conductivity type, and
a second semiconductor layer provided on the first semiconductor layer in the cell region and connected to the second electrode, the second semiconductor layer being of a second conductivity type.

Note 9

The device according to Note 8, further comprising:
a second low-stress insulating film provided at a terminal side of the first low-stress insulating film,
the second low-stress insulating film including hydrogen,
the second low-stress insulating film including
a lower portion located on the first protective film, and
an upper portion located on the terminal electrode,
the second protective film being provided also on the upper portion of the second low-stress insulating film.

Note 10

The semiconductor device according to Note 9, wherein
an angle between an upper surface of the upper portion of the second low-stress insulating film and a side surface at the cell region side of the upper portion of the second low-stress insulating film is not less than 100 degrees, and the second protective film is provided also on the upper surface of the second low-stress insulating film and on the side surface of the second low-stress insulating film.

Note 11

The device according to any one of Notes 1 to 10, further comprising:
a metal member provided on the second electrode,
an upper surface of the metal member being positioned higher than the second protective film.

Note 12

The semiconductor device according to any one of Notes 1 to 11, wherein
internal stress of the first low-stress insulating film is not more than 1/40 of internal stress of the first protective film.

Note 13

The semiconductor device according to any one of Notes 1 to 12, wherein
a thickness of the upper portion of the first low-stress insulating film is not less than 5 µm and is not more than 40 times a thickness of the first protective film.

Note 14

The semiconductor device according to any one of Notes 1 to 13, wherein
the terminal insulating film includes silicon and oxygen.

Note 15

A semiconductor device having a cell region and a terminal region set in the device, the terminal region surrounding the cell region, the device comprising:
a first electrode;
a semiconductor part provided on the first electrode;
a terminal insulating film provided on the semiconductor part in the terminal region;
a first protective film provided on the terminal insulating film, the first protective film including silicon and nitrogen;
a second electrode provided on the semiconductor part in the cell region, the second electrode including an end portion located on the first protective film;
a terminal electrode provided on the first protective film in the terminal region and connected to the semiconductor part;
a first low-stress insulating film provided on the first protective film, the first low-stress insulating film contacting the terminal electrode and the end portion of the second electrode, the first low-stress insulating film including a lower portion located between the second electrode and the terminal electrode, the first low-stress insulating film including an upper portion located higher than the second electrode and the terminal electrode;
a second protective film covering the upper portion of the first low-stress insulating film and including silicon and nitrogen; and
a metal film provided on the first low-stress insulating film and connected to the second electrode, the metal film including a portion that overlaps the terminal electrode and is separated from the terminal electrode.

What is claimed is:

1. A semiconductor device having a cell region and a terminal region set in the device, the terminal region surrounding the cell region, the device comprising:
a first electrode;
a semiconductor part provided on the first electrode;
a terminal insulating film provided on the semiconductor part in the terminal region;
a first protective film provided on the terminal insulating film, the first protective film including silicon and nitrogen;

a second electrode provided on the semiconductor part in the cell region, the second electrode including an end portion located on the first protective film;

a terminal electrode provided on the first protective film in the terminal region and connected to the semiconductor part;

a first insulating film provided on the first protective film, the first insulating film including hydrogen and contacting the terminal electrode and the end portion of the second electrode, the first insulating film including a lower portion located between the second electrode and the terminal electrode, the first insulating film including an upper portion located on the second electrode and the terminal electrode; and a second protective film covering the upper portion of the first insulating film and including silicon and nitrogen.

2. The device according to claim 1, wherein
the first insulating film further includes silicon, oxygen, and nitrogen.

3. The device according to claim 1, wherein
the second protective film contacts the terminal electrode.

4. The device according to claim 1, wherein
the second protective film contacts the first protective film at a terminal side of the terminal electrode.

5. The device according to claim 1, wherein
the second protective film contacts the second electrode.

6. The device according to claim 1, further comprising:
a metal film provided on the first insulating film and connected to the second electrode, the metal film including a portion that overlaps the terminal electrode and is separated from the terminal electrode, the semiconductor part including
a first semiconductor layer connected to the first electrode and the terminal electrode, the first semiconductor layer being of a first conductivity type, and
a second semiconductor layer provided on the first semiconductor layer in the cell region and connected to the second electrode, the second semiconductor layer being of a second conductivity type.

7. The device according to claim 6, further comprising:
a second insulating film provided at a terminal side of the first insulating film,
the second insulating film including hydrogen,
the second insulating film including
a lower portion located on the first protective film, and
an upper portion located on the terminal electrode,
the second protective film being provided also on the upper portion of the second insulating film.

8. The device according to claim 1, further comprising:
a metal member provided on the second electrode,
an upper surface of the metal member being positioned higher than the second protective film.

9. A semiconductor device having a cell region and a terminal region set in the device, the terminal region surrounding the cell region, the device comprising:
a first electrode;
a semiconductor part provided on the first electrode;
a terminal insulating film provided on the semiconductor part in the terminal region;
a first protective film provided on the terminal insulating film, the first protective film including silicon and nitrogen;
a second electrode provided on the semiconductor part in the cell region, the second electrode including an end portion located on the first protective film;
a terminal electrode provided on the first protective film in the terminal region and connected to the semiconductor part;
a first insulating film provided on the first protective film, the first insulating film contacting the terminal electrode and the end portion of the second electrode, the first insulating film including a lower portion located between the second electrode and the terminal electrode, the first insulating film including an upper portion located higher than the second electrode and the terminal electrode;
a second protective film covering the upper portion of the first insulating film and including silicon and nitrogen; and
a metal film provided on the first insulating film and connected to the second electrode, the metal film including a portion that overlaps the terminal electrode and is separated from the terminal electrode.

* * * * *